(12) United States Patent
Taniguchi

(10) Patent No.: US 7,805,294 B2
(45) Date of Patent: Sep. 28, 2010

(54) WIRELESS COMMUNICATION APPARATUS AND WIRELESS COMMUNICATION METHOD

(75) Inventor: Masaru Taniguchi, Yokohama (JP)

(73) Assignee: Kabushiki Kaisha Kenwood, Tokyo (JP)

( * ) Notice: Subject to any disclaimer, the term of this patent is extended or adjusted under 35 U.S.C. 154(b) by 861 days.

(21) Appl. No.: 11/663,273

(22) PCT Filed: Sep. 16, 2005

(86) PCT No.: PCT/JP2005/017566

§ 371 (c)(1),
(2), (4) Date: Mar. 20, 2007

(87) PCT Pub. No.: WO2006/033428

PCT Pub. Date: Mar. 30, 2006

(65) Prior Publication Data

US 2008/0103764 A1 May 1, 2008

(30) Foreign Application Priority Data

Sep. 21, 2004 (JP) .............................. 2004-273167

(51) Int. Cl.
*G10L 19/14* (2006.01)
*G10L 11/06* (2006.01)
*G10L 19/00* (2006.01)
*H03K 7/06* (2006.01)

(52) U.S. Cl. ..................... 704/205; 704/210; 704/500; 375/303

(58) Field of Classification Search ....................... None
See application file for complete search history.

(56) References Cited

U.S. PATENT DOCUMENTS 5,493,609 A * 2/1996 Winseck et al. .......... 379/93.08

(Continued)

FOREIGN PATENT DOCUMENTS

CN 1268828 10/2000

(Continued)

OTHER PUBLICATIONS

International Preliminary Examination Report (Application No. PCT/JP2005/017566) dated May 31, 2007.

(Continued)

*Primary Examiner*—Brian L Albertalli
(74) *Attorney, Agent, or Firm*—Eric J. Robinson; Robinson Intellectual Property Law Office, P.C.

(57) ABSTRACT

When a sound presence/absence detector (12) detects a sound absence interval, a non-modulated carrier signal is outputted in an area used to transmit speech data that are included in transmission data having a frame structure and that correspond to the sound absence interval. That is, an FSK modulator (14) causes a transmitting circuit (15) to output the non-modulated carrier signal from a wireless communication apparatus (100) in the area used to transmit the speech data corresponding to the sound absence interval. In the meantime, a four-level FSK modulated wave signal is outputted in the areas other than the one of the sound absence interval. A non-modulation discriminating data for allowing the sound absence interval to be determined are included in an area of channel identifying information included in the transmission data having the frame structure, and allow a communication terminal apparatus at the receiving end to avoid any unstable operations. The present invention is suitable for narrowed bands of communication paths and reduces the affections on adjacent channels.

6 Claims, 6 Drawing Sheets

U.S. PATENT DOCUMENTS

| | | | |
|---|---|---|---|
| 5,583,922 A * | 12/1996 | Davis et al. | 379/93.09 |
| 5,905,448 A * | 5/1999 | Briancon et al. | 340/7.43 |
| 6,512,748 B1 | 1/2003 | Mizuki et al. | |
| 2008/0253475 A1 * | 10/2008 | Majima | 375/296 |

FOREIGN PATENT DOCUMENTS

| | | |
|---|---|---|
| EP | 1 041 742 | 10/2000 |
| JP | 63-228860 | 9/1988 |
| JP | 11-220762 | 8/1999 |
| JP | 2002-287254 | 10/2000 |
| JP | 2002-247006 | 8/2002 |

OTHER PUBLICATIONS

International Search Report for PCT/JP2005/017566.

* cited by examiner

CENTRAL FREQUENCY : 100MHz

VERTICAL AXIS : 2kHz/div

HORIZONTAL AXIS : 10dB/div

WIRELESS COMMUNICATION APPARATUS AND WIRELESS COMMUNICATION METHOD

TECHNICAL FIELD

The present invention relates to a wireless communication apparatus and a wireless communication method.

BACKGROUND ART

Wireless communication systems that are provided with a plurality of channels such as voice channels or control channels to provide communication services to various wireless devices are known (for example, Japanese Patent Publication No. 2724917).

Now, from the perspective of improving the efficiency of use of wireless frequency bands, bands of communication paths used by wireless devices are becoming narrower. For example, part 90 of the CFR (Code of Federal Regulation) 47 defined by the FCC (Federal Communications Commission) of the U.S. makes regulations on certain wireless devices so that one communication path should be provided per 6.25 kHz from the year 2005. Then, wireless devices that can not meet this requirement will not be able to receive type approval from 2005 and will not be allowed to be sold inside the U.S.

In the case of the wireless devices that operate at this bandwidth of 6.25 kHz, the modulation spectrum at the transmitter is required to be in the range of a transmit spectral mask called "Mask E" as illustrated in FIG. 5. The restrictions imposed by the transmit spectral mask defined in this "Mask E", provide, for example: that at the frequency ±3 kHz apart from the carrier, the transmit spectrum should be below −30 dB; that in the case of wireless devices having transmission power of 10 W or more, at the frequency ±4.6 kHz apart from the carrier, the transmission spectrum should be below −65 dB; and that in the range between ±3 kHz and ±4.6 kHz from the carrier, the transmit spectrum should be below the straight line passing through −30 dB at ±3 kHz and −55 dB at ±4.5 kHz.

Conventionally, wireless devices operating at 12.5 kHz bandwidth or 25 kHz bandwidth adopt the analog FM scheme in which a carrier is directly frequency-modulated (FM) with speech signals and transmitted. However, for the matching to the transmit spectral mask defined in "Mask E" as illustrated in FIG. 5, it is required to substantially decrease the degree of frequency-modulation. Consequently, with the conventionally-used analog FM scheme, the S/N ratio is significantly degraded so that performance sufficient for practical use cannot be obtained. Therefore, in order to achieve both the matching to the transmit spectral mask and the sufficient performance, it is considered that transmitting four-level FSK signals is performed that is generated by converting all speech signals and control signals to digital signals and then FSK (Frequency Shift keying) modulating a carrier therewith.

FIG. 6 illustrates an example of a spectral distribution of a four-level FSK signal that is matched to the transmit spectral mask of "Mask E". As illustrated in FIG. 6, it is possible to match a four-level FSK signal to the transmit spectral mask of "Mask E" in the given experimental environment. Referring to FIG. 6, the power level of adjacent channels detuned by 6.25 kHz is the noise floor level. In this regard, the leak of power to the adjacent channels also seems to be sufficiently suppressed.

However, since the FSK modulation, unlike amplitude modulation (AM), is non-linear, it has the tendency of broad transmit spectrum as compared with amplitude modulation. Also, when the bandwidth of a filter (BPF: Band Pass Filter) provided in a transmitter is ±2 kHz in an actual use environment, the spectral components which extend over and from the range of Δ4.25 kHz to the range of Δ8.25 kHz (the ranges have the center point at the transmit frequency) may have affections as leakage power on adjacent channels. The property illustrated in FIG. 6 also shows there exist spectral components of the four-level FSK signal beyond the range of Δ4.25 kHz having the center point at the transmit frequency. Therefore, the level of interference with adjacent channels of wireless devices operating at 6.25 kHz bandwidth is greater than even the level of interference with adjacent channels of wireless devices operating at the conventional 12.5 kHz bandwidth. Due to such characteristics of the four-level FSK signal, a voice call conducted using a wireless device with the four-level FSK modulation scheme may cause adjacent channel interference to another wireless device that is conducting a call using an adjacent call channel.

Moreover, since the FSK modulation employs modulation signals generated by digitizing speech signals and control signals, even when sound to be transmitted is absent, speech data corresponding to the absence of sound are outputted from an speech encoding circuit. This results in the FSK signal always having a certain transmit spectral extent. On the other hand, in the analog FM scheme, which is adopted by conventional wireless devices operating at the 12.5 kHz bandwidth, a carrier is directly frequency-modulated with speech signals, so that the absence of sound only results in the output of an almost non-modulated carrier with the transmit spectrum limited to a narrower range than that for the presence of sound. In addition, considering that an actual conversation involves numerous moments where sound pressure decreases at the boundaries between words or clauses, the average degree of frequency modulation (frequency-shift keying) in the analog FM scheme may be substantially smaller than the maximum modulation degree.

Thus, since the four-level FSK modulation scheme have different characteristics from those of the Analog FM scheme, when comparing for the degrees of interference with adjacent channels, the advantage brought by the use of four-level FSK signals could be less in the case of an call of an actual conversation than the case of measuring in an given experimental environment with a fixed frequency modulation.

In light of the above-mentioned circumstances, an object of the present invention is to provide a wireless communication apparatus and a wireless communication method that are suitable for narrowed bands of communication paths and can reduce the affections on adjacent channels.

DISCLOSURE OF THE INVENTION

To achieve the above-mentioned object, a wireless communication apparatus according to a first aspect of the present invention is characterized in that it comprises:

speech data generating means for generating digitalized speech data by capturing sound;

frame data generating means for generating transmission data having a frame structure including an area used to transmit the speech data generated by the speech data generating means;

FSK modulation means for generating an FSK modulated signal corresponding to the transmission data generated by the frame data generating means;

transmission means for transmitting the modulated signal generated by the FSK modulation means to an external device at a predetermined wireless frequency band; and sound presence/absence detecting means for detecting a sound presence interval and a sound absence interval of the sound captured into the speech data generating means, and in that the transmission means transmits a non-modulated carrier signal, corresponding to the sound absence interval detected by the sound presence/absence detecting means.

The frame data generating means may change the speech data generated -by the speech data generating means at the sound absence interval detected by the sound presence/absence detecting means into non-modulation setting data used to cause the transmission means to transmit the non-modulated carrier signal, and the FSK modulation means may cause the non-modulated carrier signal to be transmitted from the transmission means by stopping the FSK modulation operation in the area of the transmission data in which a change to the non-modulation setting data was made by the frame data generating means.

The frame data generating means may generate the transmission data in which identification data for identifying the sound absence interval is contained in the frame including the area used to transmit the speech data generated by the speech data generating means at the sound absence interval detected by the sound presence/absence detecting means.

A wireless communication apparatus according to a second aspect of the present invention is characterized in that it comprises:

speech data generating means for generating digitalized speech data by capturing sound;

frame data generating means for generating transmission data having a frame structure including an area used to transmit the speech data generated by the speech data generating means;

FSK modulation means for generating a four-level FSK modulated signal corresponding to the transmission data generated by the frame data generating means;

transmission means for transmitting the modulated signal generated by the FSK modulation means to an external device at a predetermined wireless frequency band; and sound presence/absence detecting means for detecting a sound presence interval and a sound absence interval of the sound captured into the speech data generating means, and in that the FSK modulation means generates a modulated wave signal by alternately applying FSK modulation corresponding to two-level symbols that are selected from four-level symbols corresponding to the sound absence interval detected by the sound presence/absence detecting means and have a small shift from a carrier frequency.

A wireless communication method according to a third aspect of the present invention is a method of wireless communication by a wireless communication apparatus, characterized in that it comprises:

an speech data generating step of generating digitalized speech data by capturing sound;

a frame data transmitting step of generating transmission data having a frame structure including an area used to transmit the speech data generated in the speech data generating step;

an FSK modulation step of generating an FSK modulated signal corresponding to the transmission data generated in the frame data generating step;

a transmission step of transmitting the modulated signal generated in the FSK modulation step to an external device at a predetermined wireless frequency band; and a sound presence/absence detecting step of detecting a sound presence interval and a sound absence interval of the sound captured in the speech data generating step, and in that the transmission step comprises the step of transmitting a non-modulated carrier signal, corresponding to the sound absence interval detected in the sound presence/absence detecting step.

A wireless communication method according to a fourth aspect of the present invention is a method of wireless communication by a wireless communication apparatus, characterized in that it comprises:

an speech data generating step of generating digitalized speech data by capturing sound;

a frame data transmitting step of generating transmission data having a frame structure including an area used to transmit the speech data generated in the speech data generating step;

an FSK modulation step of generating a four-level FSK modulated signal corresponding to the transmission data generated in the frame data generating step;

a transmission step of transmitting the modulated signal generated in the FSK modulation step to an external device at a predetermined wireless frequency band; and a sound presence/absence detecting step of detecting a sound presence interval and a sound absence interval of the sound captured in the speech data generating step, and in that the FSK modulation step comprises the step of generating a modulated wave signal by alternately applying two-level FSK modulation corresponding to two-level symbols that are selected from four-level symbols corresponding to the sound absence interval detected in the sound presence/absence detecting step and have a small shift from a carrier frequency.

ADVANTAGEOUS EFFECT OF THE INVENTION

The present invention is suitable for narrowed bands of communication paths and can reduce the affections on adjacent channels.

BEST MODE FOR CARRYING OUT THE INVENTION

In the following, referring the drawings, a wireless communication apparatus 100 according to an embodiment of the present invention will be described in detail. The wireless communication apparatus 100 may be one that can switch from a receive operation to a transmit operation, for example, in response to a PTT (Push-To-Talk) switch (not shown)

being turned on (for example, being pressed), to perform simplex communication with other wireless communication apparatus. Alternatively, the wireless communication apparatus 100 may use one that can be applied to a trunked wireless communication system, for example, that shares a predetermined number of wireless channels with other wireless communication apparatus and performs wireless communication by transmitting RF (Radio Frequency) signals to and receiving RF signals from wireless base stations.

Figure 1:
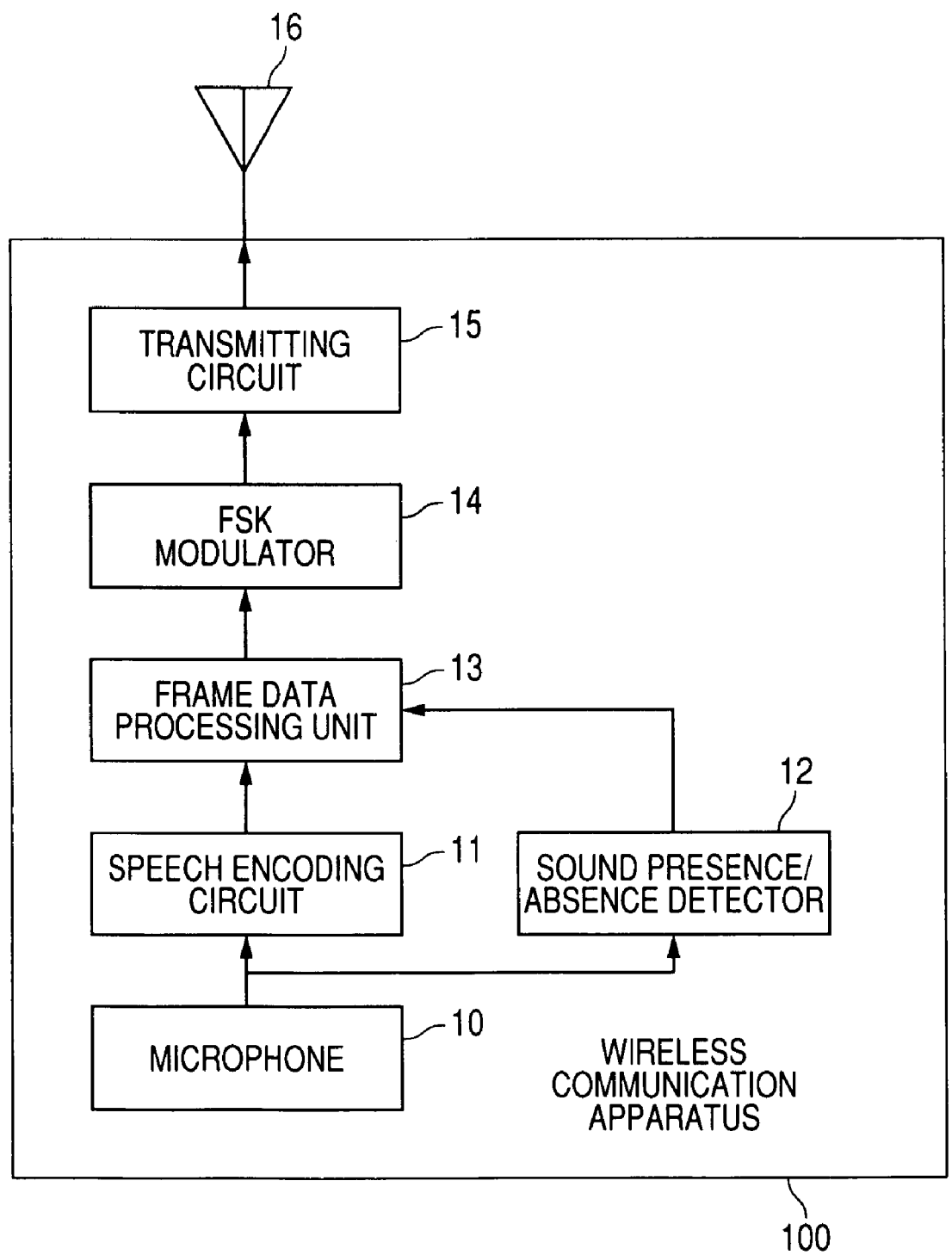
FIG. 1 is a diagram illustrating an example of configuration of a wireless communication apparatus according to an embodiment of the present invention.

FIG. 1 is a diagram illustrating an example of configuration of the wireless communication apparatus 100 according to an embodiment of the present invention. As illustrated in FIG. 1, the wireless communication apparatus 100 comprises a microphone 10, an speech encoding circuit 11, a sound presence/absence detector 12, a frame data processing unit 13, a FSK modulator 14, a transmitting circuit 15 and an antenna 16.

The microphone 10 externally captures sound and generates an speech signal as an electric signal to output to the speech encoding circuit 11. The speech encoding circuit 11 is composed of, for example, a PCM (Pulse Code Modulation) circuit such as $\Delta\Sigma$ (delta-sigma) modulator or other A/D (Analog/Digital) converter etc. and generates speech data by digital-encoding the speech signal inputted from the microphone 10 and outputs to the frame data processing unit 13.

The sound presence/absence detector 12 detects a sound presence interval and a sound absence interval of the externally-captured sound, based on the signal level of the speech signal transmitted from the microphone 10 to the speech encoding circuit 11. As a specific example, the sound presence/absence detector 12 compares the signal level of the speech signal from the microphone 10 with a predetermined sound presence threshold (for example, the signal level corresponding to a 40 dB sound) every 20 ms (millisecond) and if the signal level of the speech signal is equal to or higher than the sound presence threshold, it detects the 20 ms interval including comparison timing as a sound presence interval, while if the signal level of the speech signal is below the sound presence threshold, it detects the 20 ms interval including comparison timing as a sound absence interval. The sound presence/absence detector 12 transmits a sound presence/absence identifying signal to the frame data processing unit 13, which indicates a detection result of whether it is a sound presence interval or a sound absence interval.

The frame data processing unit 13 is composed of a processor suitable for digital data processing, such as DSP (Digital Signal Processor) or MPU (MicroProcessor Unit) etc. and generates transmission data having a predetermined frame structure by using the speech data inputted from the speech encoding circuit 11. The transmission data generated by the frame data processing unit 13 is transmitted to the FSK modulator 14.

Figure 2:
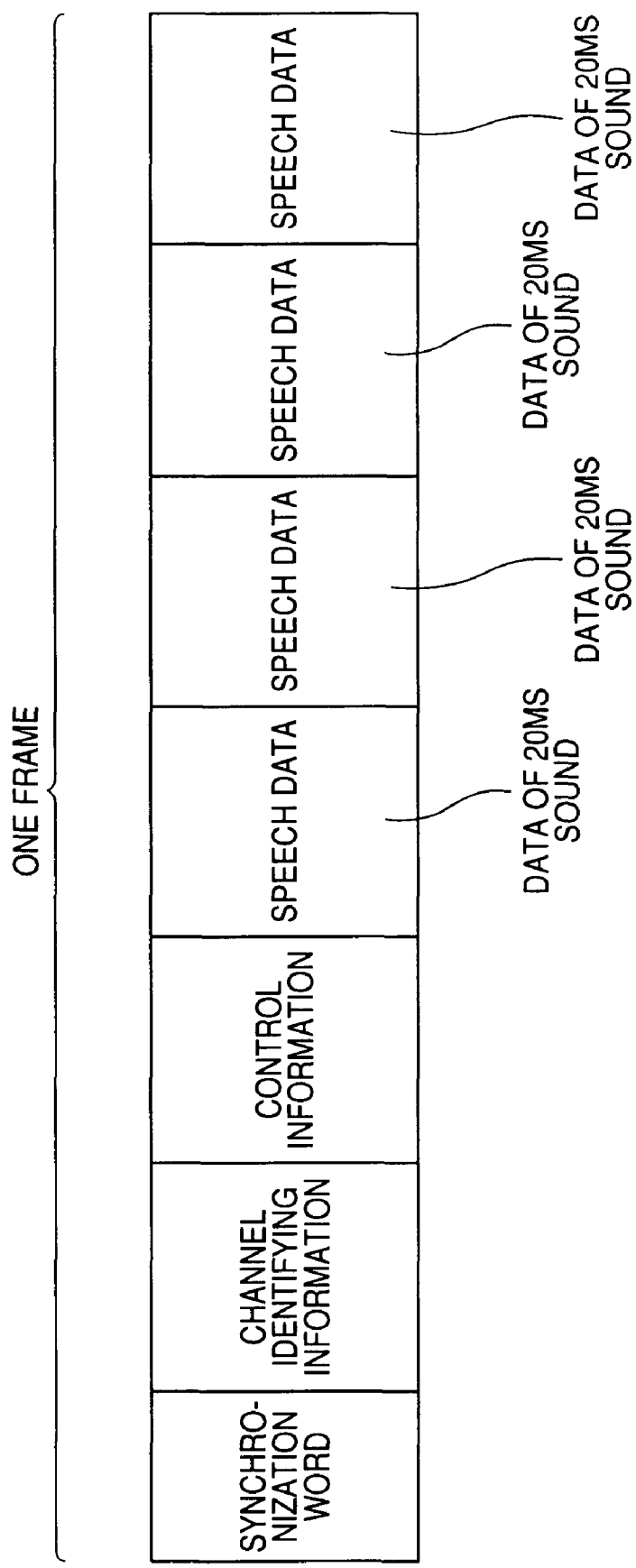
FIG. 2 is a diagram illustrating a frame structure of the transmission data generated by the frame data processing unit.

FIG. 2 is a diagram illustrating a frame structure of the transmission data generated by the frame data processing unit 13. As illustrated in FIG. 2, transmission data of one frame include an area for a, synchronization word, an area for channel identifying information, an area for control information and an area for speech data separated into several units. As a specific example, one unit of speech data is speech data corresponding to a sound of 20 ms duration and by including four units of speech data per frame, speech data corresponding to an 80 ms sound may be transmitted. Note that the synchronization word is data having a predetermined code pattern used for synchronization processing at a receiving end, channel identifying information is data to identify wireless channels and function channels and control information is data to transmit ID information etc.

Also, the frame data processing unit 13 performs the setting to cause a non-modulated carrier signal to be outputted from the wireless communication apparatus 100, corresponding to a sound absence interval detected by the sound presence/absence detector 12. As a specific example, the frame data processing unit 13 changes the speech data in the time period detected as a sound absence interval based on a sound presence/absence identifying signal from the sound presence/absence detector 12, into a non-modulation setting data to cause a non-modulated carrier signal to be outputted from the wireless communication apparatus 100. In addition, when the frame data processing unit 13 changes the speech data in the time period detected as a sound absence interval into a non-modulation setting data, it generates transmission data that allow the sound absence interval to be determined with channel identifying information. For example, channel identifying information includes 4-bits of non-modulation discriminating data that corresponds to the areas of 4 units of speech data contained in the transmission data of the same frame, respectively. Then, the setting may be made, for example, such that while the bit corresponding to the area used for transmitting speech data generated by the speech encoding circuit 11 is set to "0", the bit corresponding the area for speech data changed to non-modulation setting data is set to "1".

The FSK modulator 14 is composed of, for example, a PLL (Phase Locked Loop) circuit including a voltage control oscillator and a reference oscillator, a DDS (Direct Digital Synthesizer), or an orthogonal modulation circuit etc. and generates an FSK (Frequency Shift Keying) modulated wave signal based on the transmission data from the frame data processing unit 13. The FSK modulator 14 also generates a non-modulated wave such as a non-modulated carrier signal by, for example, stopping the FSK modulation operation when the transmission data from the frame data processing unit 13 are non-modulation setting data. The output signal from the FSK modulator 14 such as a modulated wave signal or a non-modulated carrier signal generated by the FSK modulator 14 is transmitted to the transmitting circuit 15. The transmitting circuit 15 is composed of, for example, a up-converter and a power amplifier etc. and based on the output signal from the FSK modulator 14, generates an RF signal of the band corresponding to a wireless channel used by the wireless communication apparatus 100 and supplies to the antenna 16. For example, the transmitting circuit 15 causes a four-level FSK modulated wave signal or a non-modulated carrier signal generated by the FSK modulator 14 to be transmitted and outputted from the antenna 16 at the wireless frequency band corresponding to the wireless channel.

Figure 3:
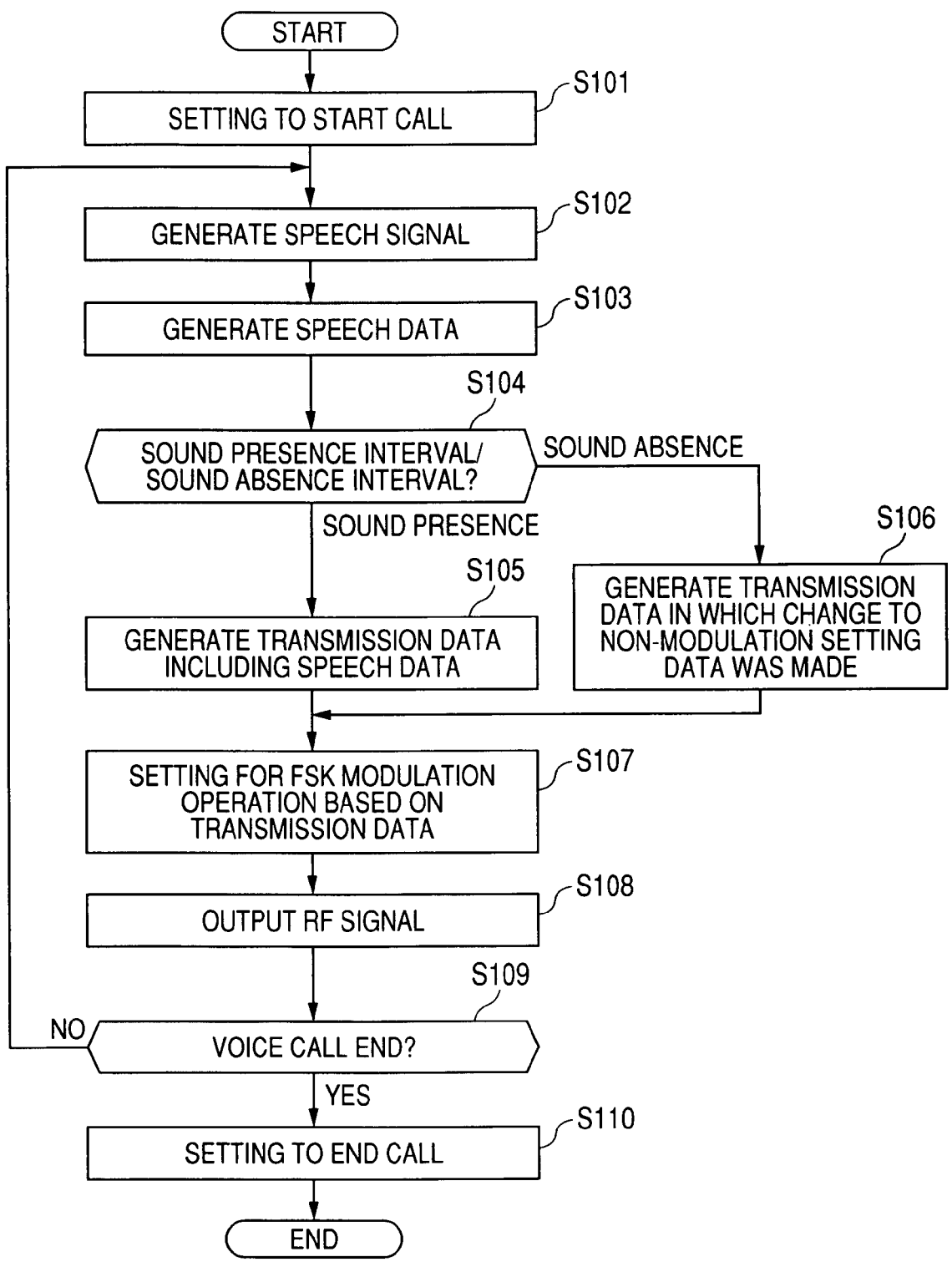
FIG. 3 is a flow diagram illustrating an example of a process executed in a wireless communication apparatus.

In the following, the operations of the wireless communication apparatus 100 according to an embodiment of the present invention will be described. FIG. 3 is a flow diagram illustrating an example of a process executed in the wireless communication apparatus 100. Beginning the process illustrated in FIG. 3, the wireless communication apparatus 100 first performs the default setting for starting a voice call (conversation) (step S101).

More specifically, when the wireless communication apparatus 100 calls a communication terminal apparatus of the other party, it starts an operation of transmitting RF signals to an external device such as a communication terminal apparatus of the other party (or a predetermined relay device) by starting to supply power to each part illustrated in FIG. 1, in response to an operation of turning on (for example, pressing) a PTT (Push-To-Talk) switch (not shown), for example.

A voice call is thus started, the microphone 10 externally captures sound to generate an speech signal and transmits to the speech encoding circuit 11 (step S102). In the speech encoding circuit 11, speech data are generated by digitalizing the speech signal from the microphone 10 and are transmitted to the frame data processing unit 13 (step S103). Here, the sound presence/absence detector 12 checks the level of the speech signal outputted from the microphone 10 at every predetermined period of time (for example, 20 ms) and determines whether it is a sound presence interval or a sound absence interval (step S104).

When the sound presence/absence detector 12. determines it is a sound presence interval (step S104; sound presence), the frame data processing unit 13 generates transmission data having a frame structure as illustrated in FIG. 2 that include the speech data transmitted from the speech encoding circuit 11 (step S105). On the other hand, when the sound presence/absence detector 12 determines it is a sound absence interval (step S104; sound absence), the frame data processing unit 13 generates transmission data in which the portion corresponding to the sound absence interval of the speech data transmitted from the speech encoding circuit 11 has been changed into non-modulation setting data (step S106). Here, the frame data processing unit 13 sets the area in which the speech data have been changed into the non-modulation setting data, identifiable as a sound absence interval with the non-modulation discriminating data contained in channel identifying information. The transmission data thus generated in the frame data processing unit 13 are transmitted to the FSK modulator 14.

The FSK modulator 14 performs the setting for a FSK modulation operation based on the transmission data from the frame data processing unit 13 (step S107). Here, when the transmission data include non-modulation setting data, the FSK modulator 14 generates a non-modulated carrier signal by, for example, stopping the FSK modulation operation in the time period corresponding to the length of the non-modulation setting data. On the other hand, for the portion in which the transmission data includes a synchronization word, channel identifying information or control information, or speech data generated by the speech encoding circuit 11, the FSK modulator 14 performs an FSK modulation operation that corresponds to the transmission data received from the frame data processing unit 13 and generates a four-level FSK signal, for example, at a wireless frequency band that corresponds to the wireless channel. Note that the FSK modulator 14 is not limited to one that generates a four-level FSK signal at a wireless frequency band but may be one that generates a signal of a predetermined Intermediate Frequency (IF) band. The modulated signal of the wireless frequency band (or Intermediate Frequency band) thus generated by the FSK modulator 14 is transmitted to the transmitting circuit 15.

The transmitting circuit 15 causes an RF signal to be outputted from the wireless communication apparatus 100 to the outside, by converting (up-converting) to the wireless channel band that transmits the frequency of the signal transmitted from the FSK modulator 14 or amplifying the signal and supplying to the antenna 16 (step S108). Also, the wireless communication apparatus 100 determines whether to end the voice call or not (step S109). Here, in response to an operation of turning off a PTT switch for example, if it is determined that the voice call is to be ended (step S109; Yes), a call-ending setting to end the voice call is made (step S110). On the other hand, when at step S109, it is determined the voice call is not to be ended but continue (step S109; No), it returns to the process of step S102 and continues to execute the process of generating an speech signal, etc.

Note that in the processes from step S102 to step S108, only one of the processes does not necessarily have to be sequentially selected and executed, but several processes may be executed in parallel by sharing the processes among each part of the wireless communication apparatus 100.

Figure 4:
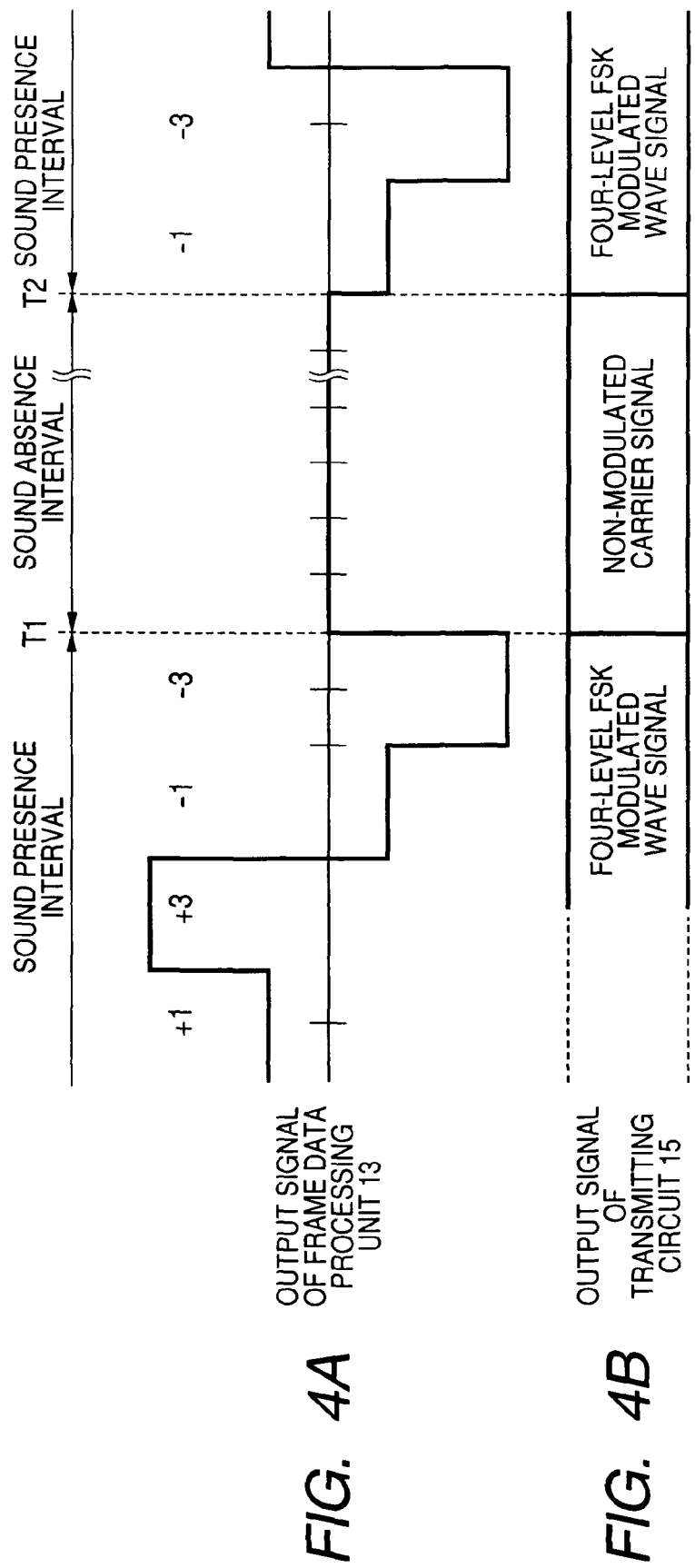
FIG. 4 is a diagram illustrating an example of specific operations in a wireless communication apparatus.
Figure 5:
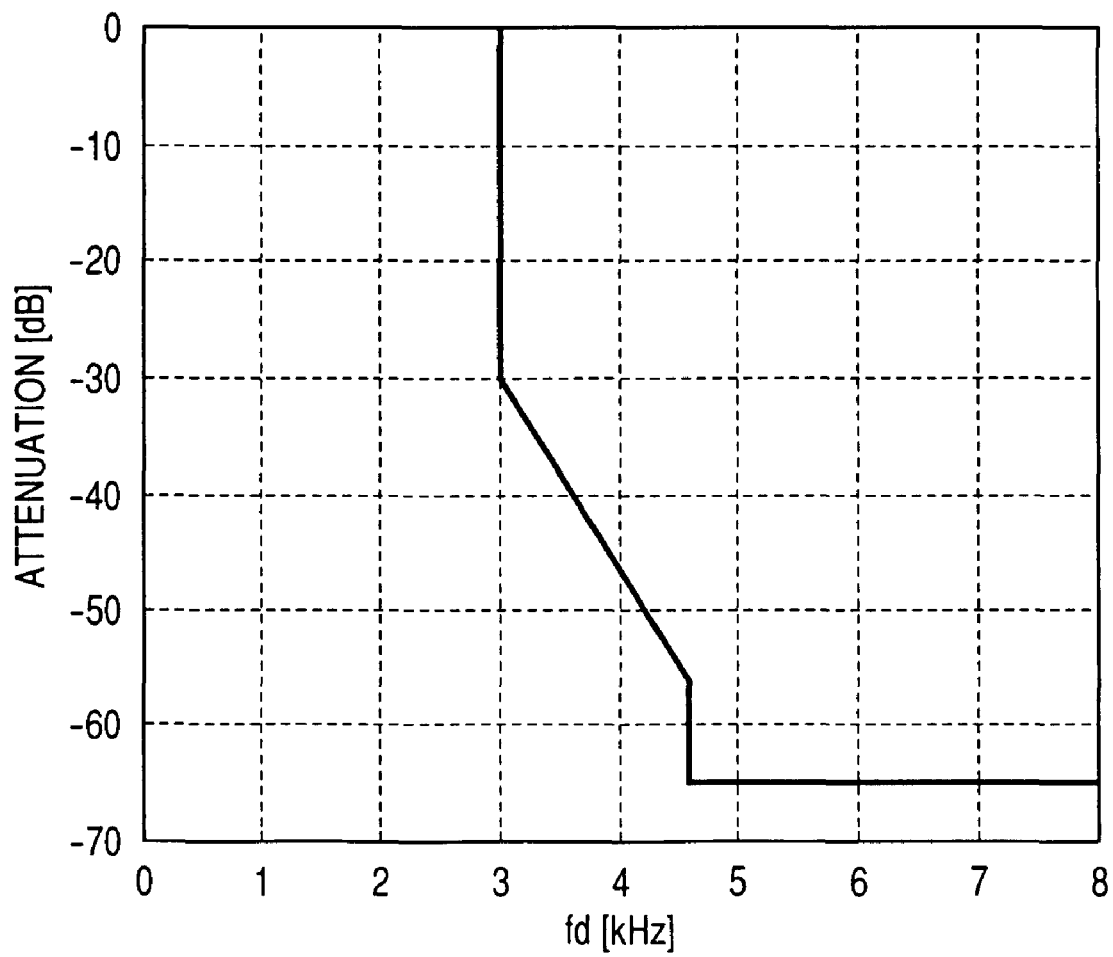
FIG. 5 is a diagram illustrating the transmit spectral mask defined in "Mask E"
Figure 6:
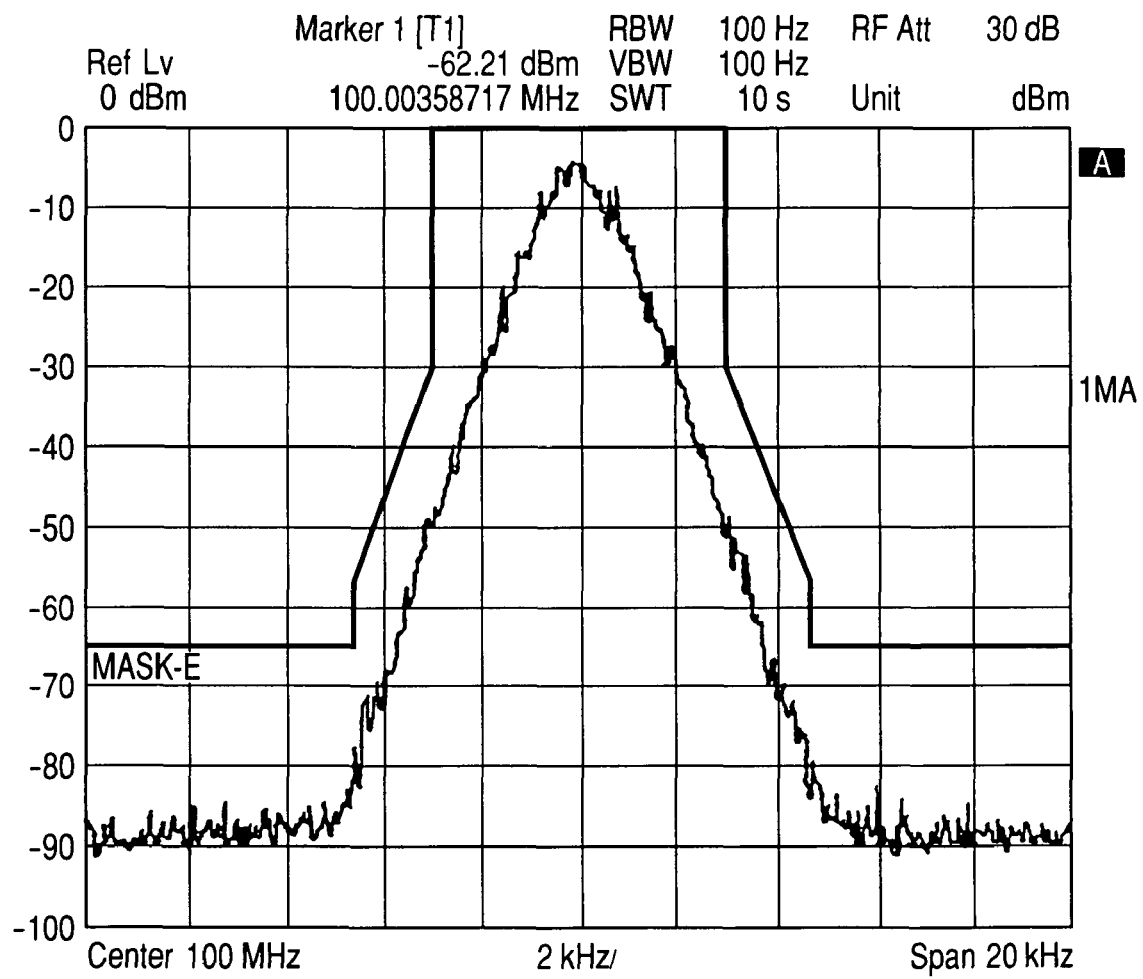
FIG. 6 is a diagram illustrating an example of a spectral distribution of a four-level FSK signal matched to the transmit spectral mask shown in FIG. 5.

Next, referring to FIGS. 4(A) and (B), an example of a specific operation of the wireless communication apparatus 100 will be described. Here, FIG. 4(A) illustrates an example of signals outputted from the frame data processing unit 13 to the FSK modulator 14 in the wireless communication apparatus 100. FIG. 4(B) illustrates an example operation of outputting signals by the transmitting circuit 15 in the wireless communication apparatus 100.

For example, as illustrated in FIG. 4(A), in the time period until timing T1, in response to the sound presence/absence detector 12 having detected it as a sound presence interval, the frame data processing unit 13 includes the speech data generated by the speech encoding circuit 11 in transmission data having a frame structure as illustrated in FIG. 2 and outputs to the FSK modulator 14. Here, in the example illustrated in FIG. 4(A), the speech data generated by the speech encoding circuit 11 are a rectangular wave signal consisting of four-signal levels as a four-level symbol data sequence.

Here the FSK modulator 14 outputs a four-level FSK modulated wave signal to the transmitting circuit 15 in the time period until timing T1 by performing the FSK modulation operation corresponding the transmission data from the frame data processing unit 13. In response to this FSK modulation operation by the FSK modulator 14, the transmitting circuit 15 performs power amplification etc. on the four-level FSK modulated wave signal and causes it to be outputted from the wireless communication apparatus 100 in the time period until timing T1, as illustrated in FIG. 4(B).

Then, the time period from timing T1 to timing T2 corresponds to a transmission period of speech data corresponding to the time period that the sound presence/absence detector 12 detects as a sound absence interval in transmission data having a frame structure as illustrated in FIG. 2. In this case, from the frame data processing unit 13, a zero-level transmission data signal as non-modulation setting data is outputted instead of the speech data generated by the speech encoding circuit 11, for example, as illustrated in FIG. 4(A).

In this case, in response to the transmission data signal outputted from the frame data processing unit 13 from timing T1 to timing T2 being zero-level, the FSK modulator 14 causes the transmitting circuit 15 -to output a non-modulated carrier signal from the wireless communication apparatus 100 as illustrated FIG. 4(B), by for example stopping the FSK modulation operation.

The time period that the non-modulated carrier signal is thus outputted can be determined by a communication terminal apparatus at the receiving end with non-modulation discriminating data contained in channel identifying information in transmission data having a frame structure as illustrated in FIG. 2. In the time period that the non-modulated carrier signal is outputted, synchronization processing such as clock reproduction can not be performed at the communication terminal apparatus at the receiving end and the receive operation is expected to be unstable. Therefore, allowing the communication terminal apparatus at the receiving end to determine a non-modulation period with non-modulation discriminating data can prevent the receive operation from becoming unstable. That is, the communication terminal apparatus at the receiving end can avoid any unstable operations in the area for non-modulated speech data, by interrupting performing synchronization processing in the non-modulation time period identified with the non-modulation discriminating data contained in the channel identifying information and putting it in a freewheel state that maintains the clock reproduction timing, such as operating (free-running) a demodulation circuit at a free-running frequency, for example.

Also, the fact that in the non-modulation period the speech data generated by the speech encoding circuit 11 are not transmitted prevents the communication terminal apparatus at the receiving end from outputting sound. Therefore, in the case of the non-modulation period determined by the communication terminal apparatus at the receiving end with non-modulation discriminating data, it is possible to output sound that sounds natural to users by repetitively using pervious speech data or using pre-prepared fixed data such as background noise.

Moreover, in the time period from timing T2, in response to the sound presence/absence detector 12 having detected it as a sound presence interval (or to the timing of transmitting a synchronization word in the transmission data of the following frame), the frame data processing unit 13 outputs a four-level symbol data sequence corresponding to the speech data (or predetermined synchronization word) generated by the speech encoding circuit 11 to the FSK modulator 14. The FSK modulator 14 outputs a four-level FSK modulated wave signal to the transmitting circuit 15 in the time period from timing T2 by performing the FSK modulation operation corresponding to the transmission data from the frame data processing unit 13. Consequently, the transmitting circuit 15 causes the four-level FSK modulated wave signal to be outputted from the wireless communication apparatus 100 in the time period from timing T2.

As described above, according to the present invention, when a sound absence interval is detected by the sound presence/absence detector 12, in that area of transmission data having a frame structure that is used to transmit speech data corresponding to a sound absence interval, a non-modulated wave is generated by the FSK modulator 14 and a non-modulated carrier signal is output from the wireless communication apparatus 100. Here, the non-modulated carrier signal includes only the frequency components corresponding to the central frequency of a wireless channel used by the wireless communication apparatus 100 and only a little broadening in the spectrum of the transmission signal can be seen. Therefore, an RF signal with substantially narrower band than the four-level FSK modulated wave signal is outputted and the affections on adjacent channels can be reduced.

In this case, the level of interference with adjacent channels is the average of the duration of time where a normal four-level FSK modulated wave signal is outputted corresponding to speech data in a sound presence interval or transmission data other than speech data and the duration of time where a non-modulated carrier signal is outputted corresponding to speech data in a sound absence interval. Therefore, as more intervals are detected as sound absence intervals by the sound presence/absence detector 12, the level of interference with adjacent channels can be reduced and it is possible to be suitable for narrowed bands of communication paths and reduce the affections on adjacent channels.

Also in the area for channel identifying information of the transmission data having a frame structure, non-modulation discriminating data that allow a sound absence interval to be determined are included. This enables to perform control to avoid unstable operations, such as determined the time period that a non-modulated carrier signal is transmitted and, for example, interrupting synchronization processing during the determined period at a communication terminal apparatus at the receiving end.

The present invention is not limited to the above-described embodiment and various modifications and applications can be made. That is, although the above-described embodiment describes that in a transmission period of speech data corresponding to a sound absence interval, a non-modulated carrier signal is outputted, it is not limited to this, and it can employ other methods that allow to reduce the affections on adjacent channels.

For example, in a transmission period of speech data corresponding to a sound absence interval, a two-level FSK modulated wave signal may be outputted by selecting from four symbols (codes) (for example, −3, −1, +1 and +3) used in four-level modulation, only two symbols (for example, −1 and +1) with a small modulation degree, i.e. those with a small shift from the carrier frequency (the central frequency of the channel).

In this case, as the time period from timing T1 to timing T2 illustrated in FIG. 4(A), for example, in a transmission period of speech data corresponding to a sound absence interval detected by the sound presence/absence detector 12, the frame data processing unit 13 continuously outputs a symbol sequence indicating "−1, +1" instead of the speech data generated by the speech encoding circuit 11. Then, the FSK modulator 14 causes the transmitting circuit 15 to output an FSK modulated wave signal generated corresponding to the symbol of "+1" and the symbol of "−1" from the wireless communication apparatus 100, for example, in the time period from timing T1 to timing T2. That is, in the transmission period of speech data corresponding to a sound absence interval, a two-level FSK modulated wave signal is transmitted from the FSK modulator 14 to the transmitting circuit 15, and from the wireless communication apparatus 100, a modulated wave signal generated by alternately applying FSK modulations corresponding to two symbols, "+1" and "−1" is outputted.

In such a case that a two-level FSK modulated wave signal is outputted even in the transmission period of speech data corresponding to a sound absence interval, since synchronization processing such as clock reproduction can be performed at a communication terminal apparatus at the receiving end, the non-modulation discriminating information that is included in the channel identifying information in the above embodiment can be omitted. Alternatively, even if a two-level FSK modulated wave signal is outputted in the transmission period of speech data corresponding to a sound absence interval, a sound absence interval may be determined at the communication terminal apparatus at the receiving end, by including non-modulation discriminating data in channel identifying information in a similar manner as the above embodiment. That is, since data transmitted in an area for speech data corresponding to a sound absence interval are data different from valid speech data generated by the speech encoding circuit 11, including non-modulation discriminating data in channel identifying information allows the communication terminal apparatus at the receiving end to determine the time period that invalid speech data are transmitted. In the time period that determined invalid speech data are transmitted by the communication terminal apparatus at the receiving end, it is possible to output sound that sounds natural to users by repetitively using pervious speech data or using pre-prepared fixed data such as background noise, as the above-described embodiment.

The above-described embodiment also describes that when a sound absence interval is detected by the sound presence/absence detector 12, the frame data processing unit 13 causes a non-modulated carrier signal to be outputted from the wireless communication apparatus 100 by changing speech data generated by the speech encoding circuit 11 into non-modulation setting data in the area for the speech data in the frame. However, the present invention is not limited to this, and can employ any configuration to stop the FSK modulation operation of the FSK modulator 14. For example, in the timing of outputting speech data corresponding to a sound absence interval in transmission data, the frame data processing unit 13 may transmit to the FSK modulator 14, a non-modulation control signal to cause a non-modulated carrier signal (or an intermediate frequency signal) to be outputted from the FSK modulator 14 independently of transmission data having a frame structure as illustrated in FIG. 2.

Moreover, speech data outputted from the speech encoding circuit 11 to the frame data processing unit 13 and transmission data outputted from the frame data processing unit 13 to the FSK modulator 14 may be subject to a predetermined encryption process to ensure the privacy of a voice call.

The invention claimed is:

1. A wireless communication apparatus comprising:
speech data generating means for generating digitally-encoded speech data from an incoming speech signal;
frame data generating means for generating transmission data having a frame structure including an area used to transmit the speech data generated by the speech data generating means as n-level symbol speech data, where n is an integer equal to or greater than 2;
FSK modulation means for generating an FSK modulated signal corresponding to the transmission data generated by the frame data generating means by n-level FSK modulating carrier wave, where said FSK modulated signal having any level of n-level FSK modulation is generated by modulating said carrier wave;
transmission means for transmitting the modulated signal generated by the FSK modulation means to an external device at a predetermined wireless frequency band; and
sound presence/absence detecting means for detecting a sound presence interval and a sound absence interval of the incoming speech signal, and
wherein said frame data generating means replaces the speech data generated by the speech data generating means at the sound absence interval detected by said sound presence/absence detecting means with non-modulation setting data including symbol data having a level other than n-level symbol; and
wherein said FSK modulation means outputs the non-modulated carrier signal in response to said non-modulation setting data in the frame data.

2. The wireless communication apparatus of claim 1, characterized in that the FSK modulation means stops the FSK modulation operation in response to said non-modulation setting data.

3. The wireless communication apparatus of claim 1 or 2, characterized in that the frame data generating means generates transmission data in which identification data for identifying the sound absence interval is contained in the frame including the area used to transmit the speech data generated by the speech data generating means at the sound absence interval detected by the sound presence/absence detecting means.

4. A wireless communication apparatus comprising:
speech data generating means for generating digitalized speech data by capturing sound;
frame data generating means for generating transmission data having a frame structure including an area used to transmit the speech data generated by the speech data generating means;
FSK modulation means for generating a four-level FSK modulated signal corresponding to the transmission data generated by the frame data generating means;
transmission means for transmitting the modulated signal generated by the FSK modulation means to an external device at a predetermined wireless frequency band; and
sound presence/absence detecting means for detecting a sound presence interval and a sound absence interval of the sound captured into the speech data generating means, and
wherein the FSK modulation means generates a two-level FSK modulated signal corresponding to predetermined invalid speech data including two-level symbols that are selected from four-level symbols corresponding to the sound absence interval detected by the sound presence/absence detecting means and have a small shift from a carrier frequency.

5. A wireless communication method by a wireless communication apparatus, said method comprising:
a speech data generating step of generating digitally-encoded speech data from an incoming speech signal;
a frame data transmitting step of generating transmission data having a frame structure including an area used to transmit the speech data generated in the speech data generating step as n-level symbol speech data, where n is an integer equal to or greater than 2;
an FSK modulation step of generating an FSK modulated signal corresponding to the transmission data generated in the frame data generating step by n-level FSK modulating carrier wave, where said FSK modulated signal having any level of n-level FSK modulation is generated by modulating said carrier wave;
a transmission step of transmitting the modulated signal generated in the FSK modulation step to an external device at a predetermined wireless frequency band; and
a sound presence/absence detecting step of detecting a sound presence interval and a sound absence interval of the incoming speech signal, and
wherein said frame data generating step replaces the speech data generated in the speech data generating step at the sound absence interval detected in said sound presence/absence detecting step with non-modulation setting data including symbol data having a level other than n-level symbol; and
wherein said FSK modulation step outputs the non-modulated carrier signal in response to said non-modulation setting data in the frame data.

6. A wireless communication method by a wireless communication apparatus, said method comprising:
a speech data generating step of generating digitalized speech data by capturing sound;
a frame data transmitting step of generating transmission data having a frame structure including an area used to transmit the speech data generated in the speech data generating step;
an FSK modulation step of generating a four-level FSK modulated signal corresponding to the transmission data generated in the frame data generating step;
a transmission step of transmitting the modulated signal generated in the FSK modulation step to an external device at a predetermined wireless frequency band; and
a sound presence/absence detecting step of detecting a sound presence interval and a sound absence interval of the sound captured in the speech data generating step, and
wherein the FSK modulation step comprises the step of generating a two-level FSK modulated wave signal corresponding to predetermined invalid speech data including two-level symbols of four-level symbols that are selected from four-level symbols corresponding to the sound absence interval detected in the sound presence/absence detecting step and have a small shift from a carrier frequency.

* * * * *